(12) United States Patent
Fujita et al.

(10) Patent No.: US 10,333,513 B2
(45) Date of Patent: Jun. 25, 2019

(54) SIGNAL MULTIPLEXER

(71) Applicant: THINE ELECTRONICS, INC., Tokyo (JP)

(72) Inventors: Yusuke Fujita, Chiyoda-ku (JP); Satoshi Miura, Suginami-ku (JP)

(73) Assignee: THINE ELECTRONICS, INC., Chiyoda-ku, Tokyo (JP)

(*) Notice: Subject to any disclaimer, the term of this patent is extended or adjusted under 35 U.S.C. 154(b) by 0 days.

(21) Appl. No.: 15/596,200

(22) Filed: May 16, 2017

(65) Prior Publication Data

US 2017/0338813 A1 Nov. 23, 2017

(30) Foreign Application Priority Data

May 17, 2016 (JP) ................................. 2016-098767

(51) Int. Cl.
*H03K 17/284* (2006.01)
*H03K 17/693* (2006.01)
*H03K 19/20* (2006.01)

(52) U.S. Cl.
CPC ......... *H03K 17/284* (2013.01); *H03K 17/693* (2013.01); *H03K 19/20* (2013.01)

(58) Field of Classification Search
CPC ..... H03K 17/284; H03K 17/693; H03K 19/20
USPC .................................................. 370/229–238
See application file for complete search history.

(56) References Cited

PUBLICATIONS

Jihwan Kim et al., "A 16-to-40Gb/s Quarter-Rate NRZ/PAM4 Dual-Mode Transmitter in 14nm CMOS", 2015 IEEE International Solid-State Circuits Conference, Feb. 23, 2015, ISSCC 2015, Session 3, 3.5, pp. 60-62.

*Primary Examiner* — Ryan Jager
(74) *Attorney, Agent, or Firm* — Sughrue Mion, PLLC

(57) ABSTRACT

A signal multiplexer according to the present embodiment has a configuration sufficiently capable of accelerating a data rate. The signal multiplexer includes M number of front units and a rear unit. An m-th front unit $A_m$ outputs an output signal corresponding to an m-th input signal $I_m$ when both the control signal $C_m$ and the control signal $C_n$ are significant levels, and outputs an output signal having a fixed level when at least either one of the control signal $C_m$ or the control signal $C_n$ is an non-significant level. A rear unit B receives signals from the front units, and outputs a signal having a different signal level in a case in which all the output signals from the front units are the same level or in the other case.

18 Claims, 15 Drawing Sheets

Fig.2

| CONTROL SIGNAL | | | | | OUTPUT SIGNAL OF FRONT UNIT | | | | OUTPUT SIGNAL OF REAR UNIT |
|---|---|---|---|---|---|---|---|---|---|
| $C_1$ | $C_2$ | $C_3$ | ... | $C_M$ | $A_1$ | $A_2$ | ... | $A_M$ | B |
| SIGNIFICANT | SIGNIFICANT | NON-SIGNIFICANT | ... | NON-SIGNIFICANT | $i_1$ | FIXED | ... | FIXED | $I_1$ |
| NON-SIGNIFICANT | SIGNIFICANT | SIGNIFICANT | ... | NON-SIGNIFICANT | FIXED | $i_2$ | ... | FIXED | $I_2$ |
| ... | ... | ... | ... | ... | ... | ... | ... | ... | ... |
| SIGNIFICANT | NON-SIGNIFICANT | NON-SIGNIFICANT | ... | SIGNIFICANT | FIXED | FIXED | ... | $i_M$ | $I_M$ |

SIGNAL MULTIPLEXER

TECHNICAL FIELD

The present invention relates to a signal multiplexer.

BACKGROUND

Jihwan Kimetal., "A 16-to-40 Gb/s Quarter-Rate NRZ/PAM4 Dual-Model Transmitter in 14 nm CMOS", 2015 IEEE International Solid-State Circuits Conference (ISSCC), (US), February, 2015 (hereinafter, referred to as Non-Patent Literature 1) discloses a signal multiplexer which multiplexes four input signals and outputs one output signal (multiplexed signal). The signal multiplexer includes four buffer sections connected in parallel. Each buffer section includes a flip-flop and two transfer gates which are sequentially connected in series. Each transfer gate is adjusted so as to be turned ON at a predetermined timing. Thus, input signals input to the buffer sections are sequentially output from the signal multiplexer as one output signal.

According to the signal multiplexer disclosed in Non-Patent Literature 1, it is possible to extend the allowable range of the delay time of a flip-flop and accelerate the data rate compared with the case in which two input signals are multiplexed and one output signal is output.

SUMMARY

The inventors have studied a conventional signal multiplexer and found the following problem. That is, in the signal multiplexer disclosed in Non-Patent Literature 1, the load capacity value becomes high because one connecting point with which all the output ends of the four buffer sections are connected is formed. For this reason, the waveform of an output signal becomes dull, and the frequency band is restricted. Consequently, acceleration of the data rate has been limited in a conventional signal multiplexer.

The present invention has been made to solve such a problem as described above, and is to provide a signal multiplexer having a configuration sufficiently capable of accelerating the data rate compared with the conventional signal multiplexer.

A signal multiplexer according to the present embodiment outputs a signal (an input signal, a logically inverted signal thereof, and the like) corresponding to an input signal $I_m$ of M number of input signals $I_1$ to $I_M$ sequentially designated based on a combination of signal levels of an m-th control signal $C_m$ and an n-th control signal $C_n$ which are selected from M number of control signals $C_1$ to $C_M$, where M is an integer defined by $2^i$, i is an integer of 2 or greater, m is an integer of 1 to M, and n is an integer of 1 when m=M, and of m+1 when m<M, while the combination of the signal levels are being maintained. Specifically, the signal multiplexer includes M number of front units $A_1$ to $A_M$ corresponding to the M number of input signals $I_1$ to $I_M$, and a rear unit electrically connected with output ends of the front units $A_1$ to $A_M$. An m-th front unit $A_m$ of the M number of front units $A_1$ to $A_M$ outputs an output signal corresponding to the input signal $I_m$ input to the front unit $A_m$ when both signal levels of the control signal $C_m$ and the control signal $C_n$ are significant. On the other hand, the front unit $A_m$ outputs an output signal having a fixed signal level when at least either signal level of the control signal $C_m$ or the control signal $C_n$ is non-significant. The rear unit receives the output signals from the front units $A_1$ to $A_M$, and outputs, as the signal corresponding to the input signal $I_m$, a signal having a different signal level in a case in which all the output signals from the front units $A_1$ to $A_M$ are the same signal level or in the other case.

BRIEF DESCRIPTION OF THE DRAWINGS

FIG. 2 is a table showing the relation of signal levels of control signals $C_1$ to $C_M$, output signals of front units $A_1$ to $A_M$, and an output signal of a rear unit B in the signal multiplexer 1 according to the present embodiment;

DETAILED DESCRIPTION

Figure 1:
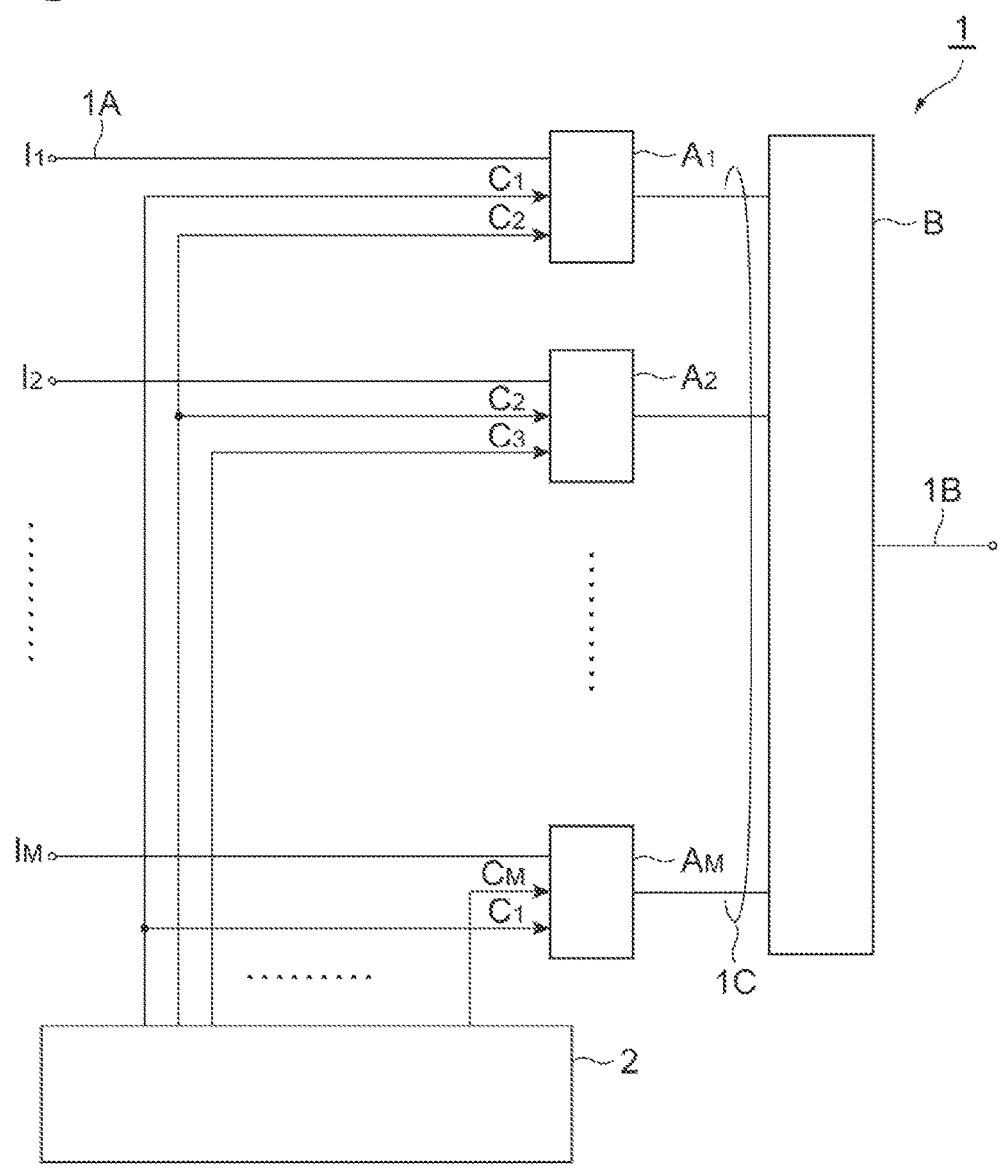
FIG. 1 is a diagram showing a configuration of a signal multiplexer 1 according to the present embodiment.

Description of Embodiments of the Present Invention

First, embodiments of the present invention are individually described in order.

(1) A signal multiplexer according to the present embodiment outputs a signal (an input signal, a logically inverted signal thereof, and the like) corresponding to an input signal $I_m$ of M number of input signals $I_1$ to $I_M$ sequentially designated based on a combination of signal levels of an m-th control signal $C_m$ and an n-th control signal $C_n$ which are selected from M number of control signals $C_1$ to $C_M$, where M is an integer defined by $2^i$, i is an integer of 2 or greater, m is an integer of 1 to M, and n is an integer of 1 when m=M, and of m+1 when m<M, while the combination of the signal levels are being maintained. As a first aspect, the signal multiplexer includes M number of front units $A_1$ to $A_M$ corresponding to the M number of input signals $I_1$ to $I_M$, and a rear unit electrically connected with output ends of the front units $A_1$ to $A_M$. An m-th front unit $A_m$ of the M number of front units $A_1$ to $A_M$ outputs an output signal corresponding to the input signal $I_m$ input to the front unit $A_m$ when both signal levels of the control signal $C_m$ and the control signal $C_n$ are significant. On the other hand, the front unit $A_m$ outputs an output signal having a fixed signal level when at least either signal level of the control signal $C_m$ or the control signal $C_n$ is non-significant (insignificant). The rear unit receives the output signals from the front units $A_1$ to $A_M$, and outputs, as the signal corresponding to the input signal $I_m$, a signal having a different signal level in a case in which all the output signals from the front units $A_1$ to $A_M$ are the same signal level or in the other case.

(2) As a second aspect applicable to the first aspect, the front unit $A_m$ may include a first transistor group including three PMOS transistors and a second transistor group including two NMOS transistors. In the first transistor group, a first PMOS transistor $T_{P1}$ includes a source electrically connected with an upper-limit reference end set to upper-limit reference potential, a gate, and a drain. A second PMOS transistor $T_{P2}$ includes a source electrically connected with the drain of the first PMOS transistor, a gate, and a drain. A third PMOS transistor $T_{P3}$ includes a source electrically connected with the drain of the second PMOS transistor, a gate, and a drain. Any one of the input signal $I_m$, the control signal $C_m$, and the control signal $C_n$ is exclusively input to the gate of each of the first to third PMOS transistors $T_{P1}$ to $T_{P3}$. On the other hand, in the second transistor group, a first NMOS transistor $T_{N1}$ includes a drain electrically connected with the drain of the third PMOS transistor $T_{P3}$, a gate, and a source electrically connected with a first lower-limit reference end set to first lower-limit reference potential lower than the upper-limit reference potential. A second NMOS transistor $T_{N2}$ includes a drain electrically connected with the drain of the third PMOS transistor $T_{P3}$, a gate, and a source electrically connected with a second lower-limit reference end set to second lower-limit reference potential lower than the upper-limit reference potential. Either one of the control signal $C_m$ or the control signal $C_n$ is exclusively input to the gate of each of the first and second NMOS transistors $T_{N1}$ and $T_{N2}$. Furthermore, the connecting points between the drain of the third PMOS transistor $T_{P3}$ and the drains of the first and second NMOS transistors $T_{N1}$ and $T_{N2}$ are electrically connected with the rear unit.

(3) As a third aspect applicable to the first aspect, the front unit $A_m$ may include a first gate circuit and a second gate circuit. The first gate circuit outputs a signal indicating a logical NAND between two of the input signal $I_m$, the control signal $C_m$, and the control signal $C_n$. The second gate circuit outputs a signal indicating a logical NOR between the output signal of the first gate circuit and the other one of the input signal $I_m$, the control signal $C_m$, and the control signal $C_n$.

(4) The rear unit according to a fourth aspect applicable to the second or third aspect may have a configuration capable of receiving output signals from the front units $A_1$ to $A_4$ of the front units $A_1$ to $A_M$ (a configuration when M=4). In this case, the rear unit having the configuration when M=4 may include two third gate circuits $G_{31}$ and $G_{32}$, and a fourth gate circuit $G_4$. The third gate circuits $G_{31}$ and $G_{32}$ each exclusively receive two signals of the output signals from the front units $A_1$ to $A_4$. Then, the third gate circuits $G_{31}$ and $G_{32}$ each output a signal indicating a logical NOR between the received signals. On the other hand, the fourth gate circuit $G_4$ receives the signals output from the third gate circuits $G_{31}$ and $G_{32}$, and outputs a signal indicating a logical NAND between the received signals.

(5) The rear unit according to a fifth aspect applicable to the second or third aspect may have a configuration capable of receiving output signals from the front units $A_1$ to $A_4$ of the front units $A_1$ to $A_M$ (a configuration when M=4). In this case, the rear unit having the configuration when M=4 may include two third gate circuits $G_{31}$ and $G_{32}$, and a fourth gate circuit $G_4$. The third gate circuits $G_{31}$ and $G_{32}$ each exclusively receive two signals of the output signals from the front units $A_1$ to $A_4$. Then, the third gate circuits $G_{31}$ and $G_{32}$ each output a signal indicating a logical NOR between the received signals. The fourth gate circuit $G_4$ receives the signals output from the third gate circuits $G_{31}$ and $G_{32}$, and outputs a signal indicating a logical AND between the received signals.

(6) The rear unit according to a sixth aspect applicable to the first aspect may have a configuration capable of receiving output signals from the front units $A_1$ to $A_8$ of the front units $A_1$ to $A_M$ (a configuration when M=8). In this case, the rear unit in the configuration when M=8 may include four third gate circuits $G_{31}$ to $G_{34}$, two fourth gate circuits $G_{41}$ and $G_{42}$, and a fifth gate circuit $G_5$. The third gate circuits $G_{31}$ to $G_{34}$ each exclusively receive two signals of the output signals from the front units $A_1$ to $A_8$. Then, the third gate circuits $G_{31}$ to $G_{34}$ each output a signal indicating a logical NOR between the received signals. The fourth gate circuit $G_{41}$ and $G_{42}$ each exclusively receive two signals of the signals output from third gate circuits $G_{31}$ to $G_{34}$. Then, the fourth gate circuits $G_{41}$ and $G_{42}$ each output a signal indicating a logical NAND between the received signals. The fifth gate circuit $G_5$ receives the signals output from the fourth gate circuits $G_{41}$ and $G_{42}$, and outputs a signal indicating a logical NOR between the received signals.

(7) As a seventh aspect applicable to the first aspect, the front unit $A_m$ may include a first transistor group including two PMOS transistors and a second transistor group including three NMOS transistors. In the first transistor group, a first PMOS transistor $T_{P1}$ includes a source electrically connected with a first upper-limit reference end set to first upper-limit reference potential, a gate, and a drain. A second PMOS transistor $T_{P2}$ includes a source electrically connected with a second upper-limit reference end set to second upper-limit reference potential, a gate, and a drain. Either one of the control signal $C_m$ or the control signal $C_B$ is exclusively input to the gate of each of the first and second PMOS transistors $T_{P1}$ and $T_{P2}$. On the other hand, in the second transistor group, a first NMOS transistor $T_{N1}$ includes a drain electrically connected with the drains of the first and second PMOS transistors $T_{P1}$ and $T_{P2}$, a gate, and a source. A second NMOS transistor $T_{N2}$ includes a drain electrically connected with the source of the first NMOS transistor $T_{N1}$, a gate, and a source. A third NMOS transistor $T_{N3}$ includes a drain electrically connected with the source of the second NMOS transistor $T_{N2}$, a gate, and a source connected with a lower-limit reference end set to lower-limit reference potential than the first and second upper-limit reference potential. Any one of the input signal $I_m$, the control signal $C_m$, and the control signal $C_n$ is exclusively input to the gate of each of the first to third NMOS transistors $T_{N1}$ to $T_{N3}$. Furthermore, the connecting points between the drains of the first and the second PMOS transistors $T_{P1}$ and $T_{P2}$ and the drain of the first NMOS transistor $T_{N1}$ are electrically connected with the rear unit.

(8) As an eighth aspect applicable to the first aspect, the front unit $A_m$ may include a first gate circuit and a second gate circuit. The first gate circuit outputs a signal indicating a logical NOR between either one of a logically inverted signal of the control signal $C_m$ or the control signal $C_n$ and the input signal $I_m$. The second gate circuit outputs a signal indicating a logical NAND between the other one of the control signal $C_m$ and the control signal $C_n$, and the output signal of the first gate circuit.

(9) The rear unit according to a ninth aspect applicable to the seventh or eighth aspect may have a configuration capable of receiving output signals from the front units $A_1$ to $A_4$ of the front units $A_1$ to $A_M$ (a configuration when M=4). In this case, the rear unit in the configuration when M=4 may include two third gate circuits $G_{31}$ and $G_{32}$, and a fourth gate circuit $G_4$. The third gate circuits $G_{31}$ and $G_{32}$ each exclusively receive two signals of the output signals from the front units $A_1$ to $A_4$. Then, the third gate circuits $G_{31}$ and $G_{32}$ each output a signal indicating a logical NAND between the received signals. The fourth gate circuit $G_4$ receives the signals output from the third gate circuits $G_{31}$ and $G_{32}$, and outputs a signal indicating a logical NOR between the received signals.

(10) The rear unit according to a tenth aspect applicable to the seventh or eighth aspect may have a configuration capable of receiving output signals from the front units $A_1$ to $A_4$ of the front units $A_1$ to $A_M$ (a configuration when M=4). In this case, the rear unit in the configuration when M=4 may include two third gate circuits $G_{31}$ and $G_{32}$, and a fourth gate circuit $G_4$. The third gate circuits $G_{31}$ and $G_{32}$ each exclusively receive two signals of the output signals from the front units $A_1$ to $A_4$. Then, the third gate circuits $G_{31}$ and $G_{32}$ each output a signal indicating a logical NAND between the received signals. The fourth gate circuit $G_4$ receives the signals output from the third gate circuits $G_{31}$ and $G_{32}$, and outputs a signal indicating a logical OR between the received signals.

(11) The rear unit according to an eleventh aspect applicable to the seventh or eighth aspect may have a configuration capable of receiving output signals from the front units $A_1$ to $A_8$ of the front units $A_1$ to $A_M$ (a configuration when M=8). In this case, the rear unit in the configuration when M=8 may include four third gate circuits $G_{31}$ to $G_{34}$, and two fourth gate circuits $G_{41}$ and $G_{42}$. The third gate circuits $G_{31}$ to $G_{34}$ each exclusively receive two signals of the output signals from the front units $A_1$ to $A_8$. Then, the third gate circuits $G_{31}$ to $G_{34}$ each output a signal indicating a logical NAND between the received signals. The fourth gate circuits $G_{41}$ and $G_{42}$ each exclusively receive two signals of the signals output from third gate circuits $G_{31}$ to $G_{34}$. Then, the fourth gate circuits $G_{41}$ and $G_{42}$ each output a signal indicating a logical NOR between the received signals. The fifth gate circuit $G_5$ receives the signals output from the fourth gate circuits $G_{41}$ and $G_{42}$, and outputs a signal indicating a logical NAND between the received signals.

(12) As a twelfth aspect applicable to at least any one aspect of the above first to eleventh aspects, the signal multiplexer may further include a generation unit which generates the control signals $C_1$ to $C_M$.

(13) The generation unit according to a thirteenth aspect applicable to the above twelfth aspect may include a configuration (a configuration when M=8) for generating the control signals $C_1$ to $C_8$ corresponding to the control signals $C_1$ to $C_M$. In this case, the generation unit in the configuration when M=8 may include first to fourth latch circuits and sixth to ninth gate circuits. The sixth gate circuit outputs, as the control signal $C_1$, a signal indicating a logical AND between a second clock obtained by dividing a first clock by two and a third clock obtained by dividing the second clock by two. The first latch circuit receives the control signal $C_1$, latches a value of the control signal $C_1$ at a falling timing of the first clock, and outputs the latched value as the control signal $C_2$. The seventh gate circuit outputs, as the control signal $C_3$, a signal indicating a logical AND between a logically inverted signal of the second clock and the third clock. The second latch circuit receives the control signal $C_3$, latches a value of the control signal $C_3$ at a falling timing of the first clock, and outputs the latched value as the control signal $C_4$. The eighth gate circuit outputs, as the control signal $C_5$, a signal indicating a logical AND between the second clock and a logically inverted signal of the third clock. The third latch circuit receives the control signal $C_5$, latches a value of the control signal $C_5$ at a falling timing of the first clock, and outputs the latched value as the control signal $C_6$. The ninth gate circuit outputs, as the control signal $C_7$, a signal indicating a logical AND between a logically inverted signal of the second clock and a logically inverted signal of the third clock. The fourth latch circuit receives the control signal $C_7$, latches a value of the control signal $C_7$ at a falling timing of the first clock, and outputs the latched value as the control signal $C_8$.

Each aspect listed in [Description of embodiment of the present invention] is applicable to each of the other aspects or all combinations of the other aspects.

Details of Embodiments of the Present Invention

Hereinafter, specific configurations of a signal multiplexer according to the present embodiment are described in detail with reference to the attached drawings. Note that, the present invention is not limited to examples to be described, is represented by claims, and includes all modifications within the meaning and scope equivalent to claims. In the description of the drawings, identical elements are denoted by the same reference signs, and overlapped descriptions are omitted.

FIG. 1 is a diagram showing a configuration of a signal multiplexer 1 according to the present embodiment. The signal multiplexer 1 in FIG. 1 multiplexes M number of input signals $I_1$ to $I_M$, and outputs one output signal (multiplexed signal). Here, M is an integer defined by $2^i$, and i is an integer of 2 or greater. The signal multiplexer 1 outputs a signal corresponding to any input signal of the M number of input signals $I_1$ to $I_M$ according to a signal level of each of M number of control signals $C_1$ to $C_M$. The signal multiplexer 1 includes M number of front units $A_1$ to $A_M$, a rear unit B, and a generation unit 2 which generates the control signals $C_1$ to $C_M$.

An m-th front unit $A_m$ of the M number of front units $A_1$ to $A_M$ receives an input signal $I_m$ of the M number of input signals $I_1$ to $I_M$, and a control signal $C_m$, a control signal $C_n$ of the M number of control signals $C_1$ to $C_M$. Here, m is an integer of 1 to M. Furthermore, n is an integer of 1 when m=M, and of m+1 when m<M. The front unit $A_m$ outputs an output signal corresponding to the input signal $I_m$ input from an input end 1A when both signal levels of the control signal $C_m$ and the control signal $C_n$ are significant. Furthermore, the front unit $A_m$ outputs an output signal having a fixed signal level when at least one signal level of either the control signal $C_m$ or the control signal $C_n$ is non-significant (insignificant). Note that, the fixed signal level (hereinafter, referred to as a fixed level) of the output signal is either of a high level (hereinafter, referred to as an H-level) or a low level (hereinafter, referred to as an L-level).

The rear unit B is connected with the output ends of the front units $A_1$ to $A_M$. In FIG. 1, 1C is a signal line group which electrically connects the front units $A_1$ to $A_M$ with the rear unit B. In other words, the front units $A_1$ to $A_M$ are connected in parallel with the rear unit B. The rear unit B receives signals output from the front units $A_1$ to $A_M$, and outputs signals corresponding to the received signal. Specifically, the rear unit B outputs a signal having a different signal level in the case in which all the signals output from the front units $A_1$ to $A_M$ are the same signal level or in the other case.

FIG. 2 is a table showing the relation of the control signals $C_1$ to $C_M$, the output signals of the front units $A_1$ to $A_M$, and the output signal of the rear unit B in the signal multiplexer 1 according to the present embodiment. In FIG. 2, the signals corresponding to the input signals $I_1$ to $I_M$ are expressed as "$I_1$" to "$I_M$" respectively. The signals corresponding to the input signals $I_1$ to $I_M$ are, specifically, the input signals $I_1$ to $I_M$, the logically inverted signals of the input signals $I_1$ to $I_M$, and the like. "Fixed" indicates a fixed level, and means that the signal level is fixed to the H-level or the L-level. Furthermore, the terms "significant" and "non-significant" in the signal level have the logically inverted relation in which "significant" indicates the H-level (signal "1") when "non-significant" indicates the L-level (signal "0") and "significant" indicates the L-level (signal "0") when "non-significant" indicates the H-level (signal "1").

Figure 3:
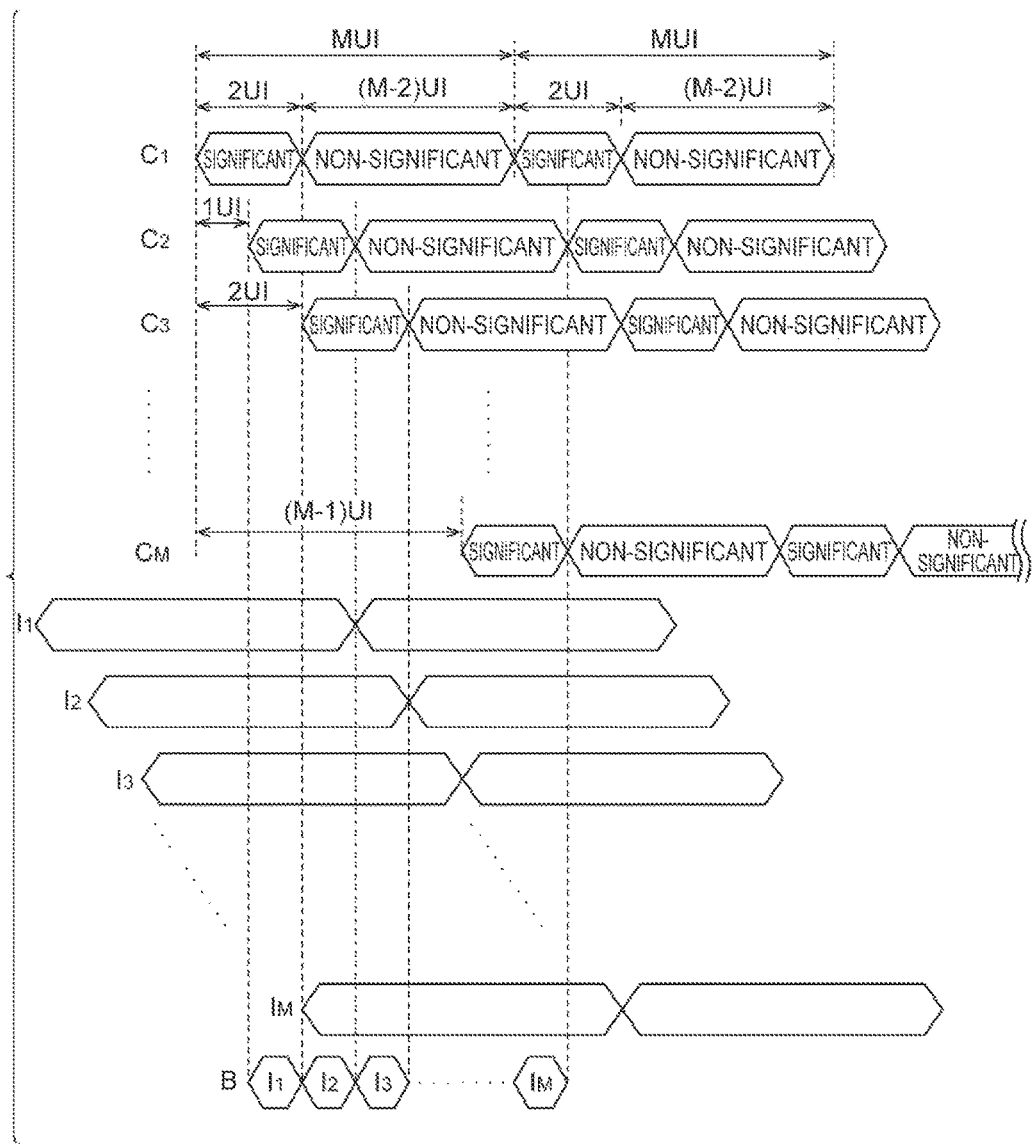
FIG. 3 is a timing chart of control signals $C_1$ to $C_M$, input signals $I_1$ to $I_M$, and an output signal of the rear unit B.

FIG. 3 is a timing chart of the control signals $C_1$ to $C_M$, the input signals $I_1$ to $I_M$, and the output signal of the rear unit B. As shown in FIG. 3, the control signals $C_1$ to $C_M$ are signals having M unit interval (UI) as one period. In the control signals $C_1$ to $C_M$, the significant level (signal level) of 2 UI and the non-significant level (signal level) of (M−2) UI are repeated. The control signal $C_m$ is delayed by (m−1) UI with respect to the control signal $C_1$. In other words, the control signal $C_2$ is delayed by 1 UI with respect to the control signal $C_1$, the control signal $C_3$ is delayed by 2 UI with respect to the control signal $C_1$, and the control signal $C_M$ is delayed by (M−1) UI with respect to the control signal $C_1$. Note that, the unit interval is the unit length of an output signal of the signal multiplexer 1. For example, when the data rate of an output signal is 40 Gb/s, 1 UI is 25 ps.

Next, a configuration example of the generation unit 2 is described.

The control signals $C_1$ to $C_4$ when M=4 are signals in which the significant level of 2 UI and the non-significant level of 2 UI are repeated and the time being the significant level and the time being the non-significant level are equal. Thus, the control signal $C_1$ and the control signal $C_3$ have the logically inverted relation, and the control signal $C_2$ and the control signal $C_4$ have the logically inverted relation. Consequently, the generation unit 2 when M=4 can generate the control signals $C_1$ to $C_4$ by, for example, including a delay circuit which delays a clock and a logic inverting circuit which inverts the logic.

Figure 4:
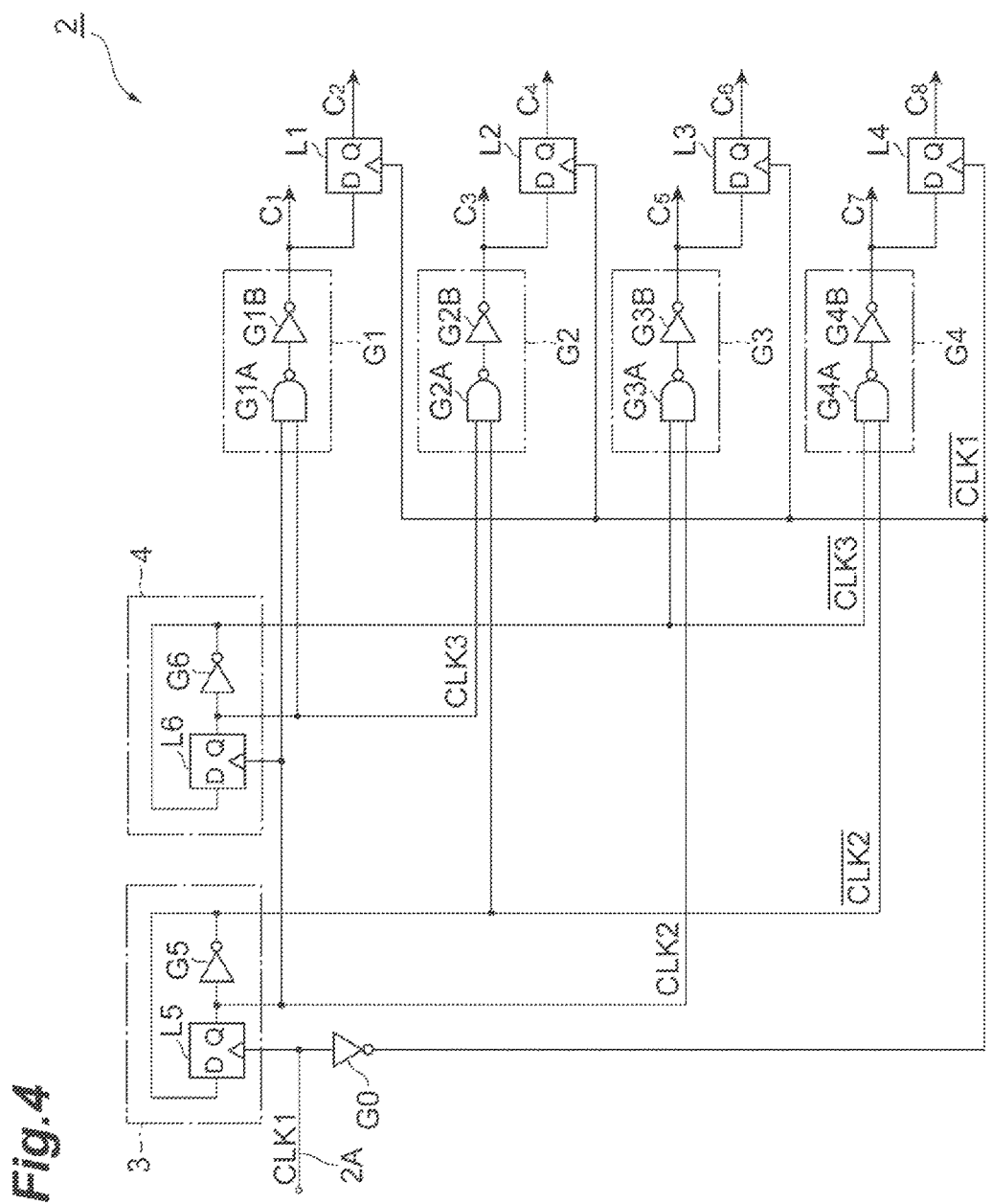
FIG. 4 is a diagram showing a configuration example of a generation unit 2 when M=8.

FIG. 4 is a diagram showing a configuration example of the generation unit 2 when M=8. As shown in FIG. 4, the generation unit 2 having the configuration when M=8 includes ½ frequency divider circuits 3 and 4, latch circuits L1 to L4, and gate circuits G0 to G4. The ½ frequency divider circuit 3 includes a latch circuit L5 and a gate circuit G5. The ½ frequency divider circuit 4 includes a latch circuit L6 and a gate circuit G6. The latch circuits L1 to L6 are implemented by, for example, D flip-flop circuits.

In the ½ frequency divider circuit 3, the latch circuit L5 receives a clock CLK1 input from an input end 2A and the output signal of the gate circuit G5, latches a value of the output signal of the gate circuit G5 at a rising timing of the clock CLK1, and outputs the latched value as a clock CLK2. The clock CLK2 is a ½ frequency division signal obtained by dividing the clock CLK1 by two. The gate circuit G5 receives the clock CLK2 which is the output signal of the latch circuit L5, and outputs a logically inverted signal of the signal of the clock CLK2. According to the ½ frequency divider circuit 3 configured in this manner, the clock CLK2 and the logically inverted signal of the clock CLK2 are generated from the clock CLK1.

In the ½ frequency divider circuit 4, the latch circuit L6 receives the clock CLK2 and the output signal of the gate circuit G6, latches a value of the output signal of the gate circuit G6 at a rising timing of the clock CLK2, and outputs the latched value as a clock CLK3. The clock CLK3 is a ½ frequency division signal obtained by dividing the clock CLK2 by two. The gate circuit G6 receives the clock CLK3 which is the output signal of the latch circuit L6, and outputs a logically inverted signal of the signal of the clock CLK3. According to the ½ frequency divider circuit 4 configured in this manner, the clock CLK3 and the logically inverted signal of the clock CLK3 are generated from the clock CLK2.

The gate circuit G0 receives the clock CLK1, and outputs a logically inverted signal of the clock CLK1.

The gate circuit G1 receives the clock CLK2 and the clock CLK3, and outputs a signal indicating a logical AND between the received signals as the control signal $C_1$. Specifically, the gate circuit G1 includes a gate circuit G1A which receives the clock CLK2 and the clock CLK3 and outputs a signal indicating a logical NAND between the received signals, and a gate circuit G1B which receives the output signal of the gate circuit G1A and outputs a logically inverted signal of the received signal as the control signal $C_1$.

The latch circuit L1 receives the logically inverted signal of the clock CLK1 and the control signal $C_1$, latches a value of the control signal $C_1$ at a rising timing of the logically inverted signal of the clock CLK1, and outputs the latched value as the control signal $C_2$. The latch circuit L1 is equivalent to a circuit which latches a value of the control signal $C_1$ at a falling timing of the clock CLK1.

The gate circuit G2 receives the logically inverted signal of the clock CLK2 and the clock CLK3, and outputs a signal indicating a logical AND between the received signals as the control signal $C_3$. Specifically, the gate circuit G2 includes a gate circuit G2A which receives the logically inverted signal of the clock CLK2 and the clock CLK3 and outputs a signal indicating a logical NAND between the received signals, and a gate circuit G2B which receives the output signal of the gate circuit G2A and outputs a logically inverted signal of the received signal as the control signal $C_3$.

The latch circuit L2 receives the logically inverted signal of the clock CLK1 and the control signal $C_3$, latches a value of the control signal $C_3$ at a rising timing of the logically inverted signal of the clock CLK1, and outputs the latched value as the control signal $C_4$. The latch circuit L2 is equivalent to a circuit which latches a value of the control signal $C_3$ at a falling timing of the clock CLK1.

The gate circuit G3 receives the clock CLK2 and the logically inverted signal of the clock CLK3, and outputs a signal indicating a logical AND between the received signals as the control signal $C_5$. Specifically, the gate circuit G3 includes a gate circuit G3A which receives the clock CLK2 and the logically inverted signal of the clock CLK3 and outputs a signal indicating a logical NAND between the received signals, and a gate circuit G3B which receives the output signal of the gate circuit G3A and outputs a logically inverted signal of the received signal as the control signal $C_5$.

The latch circuit L3 receives the logically inverted signal of the clock CLK1 and the control signal $C_5$, latches a value of the control signal $C_5$ at a rising timing of the logically inverted signal of the clock CLK1, and outputs the latched value as the control signal $C_6$. The latch circuit L3 is equivalent to the circuit which latches a value of the control signal $C_5$ at a falling timing of the clock CLK1.

The gate circuit G4 receives the logically inverted signal of the clock CLK2 and the logically inverted signal of the clock CLK3, and outputs a signal indicating a logical AND between the received signals as the control signal $C_7$. Specifically, the gate circuit G4 includes a gate circuit G4A which receives the logically inverted signal of the clock CLK2 and the logically inverted signal of the clock CLK3 and outputs a signal indicating a logical NAND between the received signals, and a gate circuit G4B which receives the output signal of the gate circuit G4A and outputs a logically inverted signal of the received signal as the control signal $C_7$.

The latch circuit L4 receives the logically inverted signal of the clock CLK1 and the control signal $C_7$, latches a value of the control signal $C_7$ at a rising timing of the logically inverted signal of the clock CLK1, and outputs the latched value as the control signal $C_8$. The latch circuit L4 is equivalent to a circuit which latches a value of the control signal $C_7$ at a falling timing of the clock CLK1.

Figure 5:
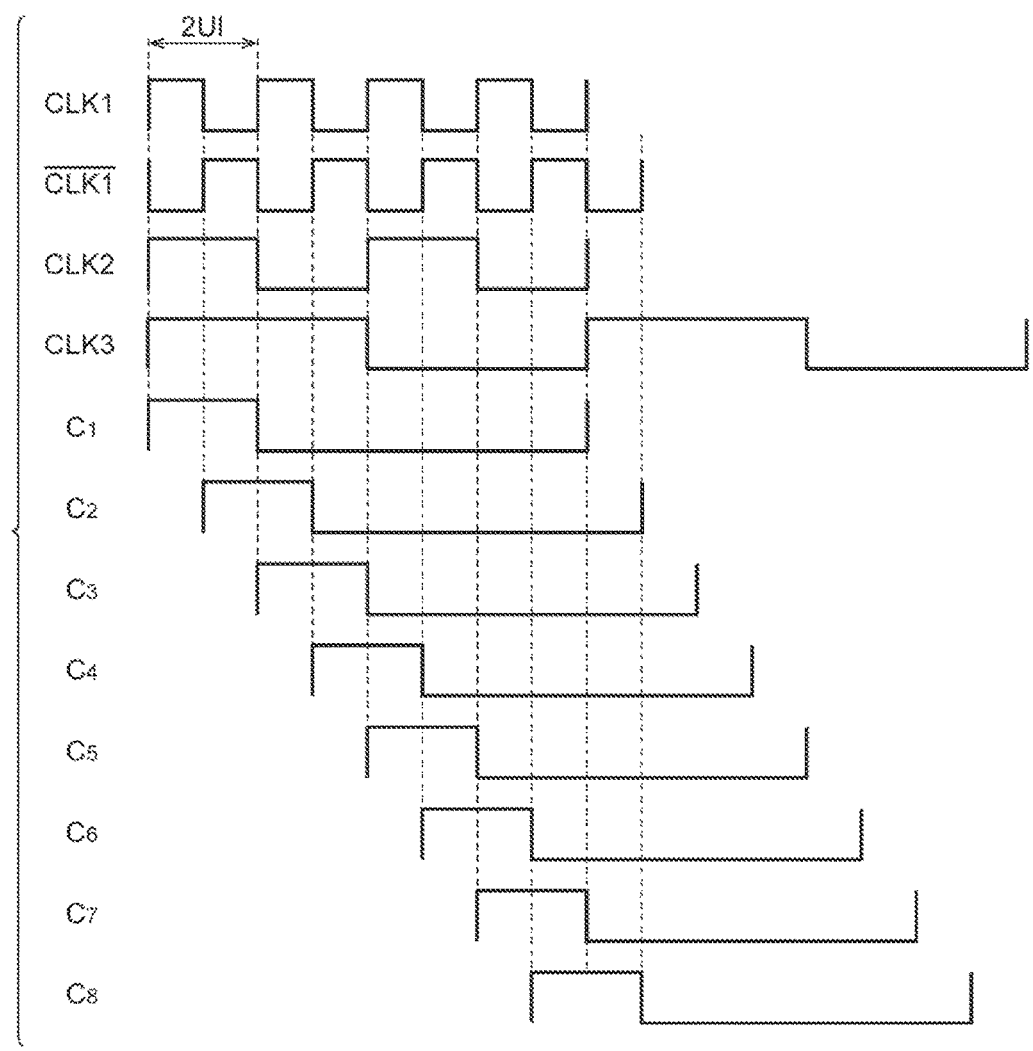
FIG. 5 is a timing chart of a clock CLK1, a logically inverted signal of the clock CLK1, a clock CLK2, a clock CLK3, and control signals $C_1$ to $C_8$ when M=8.

FIG. 5 is a timing chart of the clock CLK1, the logically inverted signal of the clock CLK1, the clock CLK2, the clock CLK3, and the control signals $C_1$ to $C_8$ when M=8.

The generation unit 2 configured in the above manner can generate the control signals $C_1$ to $C_8$ in which the significant level of 2 UI and the non-significant level of 6 UI are repeated.

Note that, since the control signals $C_1$ to $C_M$ are equivalent to M-phase clocks in which the duty ratio is 2/M and the phase is shifted by $2\pi/M$, any one of signals output from the generation unit 2 as the control signals $C_1$ to $C_M$ may be the control signal $C_1$, and the control signals $C_2$ to $C_M$ are only required to be selected so as to be signals delayed by 1 UI to (M-1) UI respectively with respect to the control signal $C_1$. Specifically, for example, the output signal of the latch circuit L1 may be the control signal $C_1$ instead of being the output signal of the gate circuit G1 as the control signal $C_1$. In this case, the control signals $C_2$ to $C_8$ are only required to be selected so as to be signals delayed by 1 UI to 7 UI respectively with respect to the control signal $C_1$. Furthermore, the generation unit 2 may receive, for example, the clock CLK2 and the clock CLK3 externally. Moreover, the generation unit 2 may receive the clock CLK2 or the clock CLK3 externally and generate a logically inverted signal of the received clock.

Next, configuration examples of the front unit $A_m$ and the rear unit B when the fixed level is the L-level are described with reference to FIGS. 6 to 10.

Figure 6:
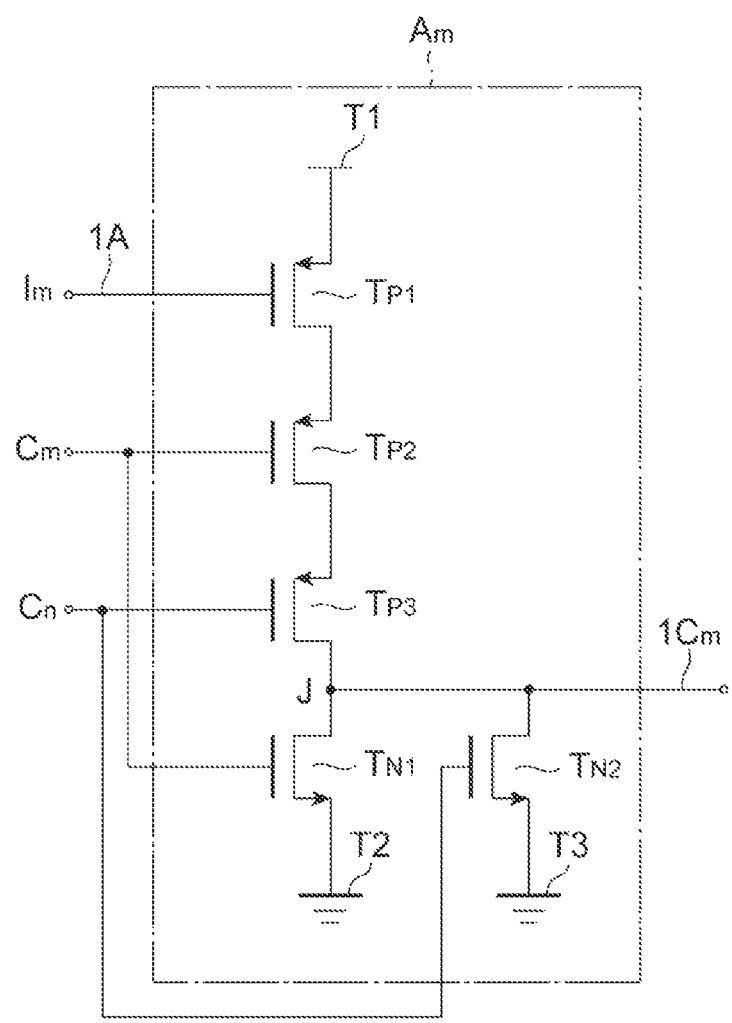
FIG. 6 is a diagram showing a first configuration example of a front unit $A_m$.

FIG. 6 is a diagram showing a first configuration example of the front unit $A_m$. As shown in FIG. 6, the first configuration example of the front unit $A_m$ includes three PMOS transistors $T_{P1}$ to $T_{P3}$ (included in a first transistor group) connected in series and two NMOS transistors $T_{N1}$ and $T_{N2}$ (included in a second transistor group) connected in parallel. The three PMOS transistors $T_{P1}$ to $T_{P3}$ and the two NMOS transistors $T_{N1}$ and $T_{N2}$ are connected in series, and its connecting point J is further connected with the rear unit B (see FIG. 1). The end part opposite to the connecting point J of the three PMOS transistors $T_{P1}$ to $T_{P3}$ is connected with a power source (an upper-limit reference end T1 set to upper-limit potential), and the end parts of the two NMOS transistors $T_{N1}$ and $T_{N2}$ opposite to the connecting point J are connected with the grounds (a first lower-limit reference end T2 set to first lower-limit potential and a second lower-limit reference end T3 set to second lower-limit potential). Note that, an output end $1C_m$ of the front unit $A_m$ is included in the signal line group 1C electrically connecting the front units $A_1$ to $A_M$ with the rear unit B.

Any one of the input signal $I_m$, the control signal $C_m$, and the control signal $C_n$ is exclusively input to the gate of each of the three PMOS transistors $T_{P1}$ to $T_{P3}$. Note that, in the example of FIG. 6, the input signal $I_m$ is input to the gate of the PMOS transistor $T_{P1}$, the control signal $C_m$ is input to the gate of the PMOS transistor $T_{P2}$, and the control signal $C_n$ is input to the gate of the PMOS transistor $T_{P3}$.

As shown in FIG. 3, after the input signal $I_m$ is output, the signals having the significant levels are output in the order of the control signal $C_m$ and the control signal $C_n$. Thus, when all the three PMOS transistors $T_{P1}$ to $T_{P3}$ shown in FIG. 6 are turned ON, the PMOS transistors are necessarily turned ON sequentially from the PMOS transistor farthest from the connecting point J. Consequently, it is possible to suppress the delay compared with, for example, the case in which the PMOS transistor farthest from the connecting point J is turned ON last.

Either one of the control signal $C_m$ or the control signal $C_n$ is exclusively input to the gate of each of the two NMOS transistors $T_{N1}$ and $T_{N2}$. In the example of FIG. 6, the control signal $C_m$ is input to the gate of the NMOS transistor $T_{N1}$, and the control signal $C_n$ is input to the gate of the NMOS transistor $T_{N2}$.

The significant levels of the control signal $C_m$ and the control signal $C_n$ are the L-levels, and the non-significant levels are the H-levels. Thus, in the first configuration example of the front unit $A_m$, when the control signal $C_m$ is the L-level and the control signal $C_n$ is the L-level, the input signal $I_m$ is output as the signal corresponding to the input signal $I_m$. On the other hand, when the control signal $C_m$ is the H-level or the control signal $C_n$ is the H-level, a signal having a voltage level of the ground is output as the signal having the L-level.

Figure 7:
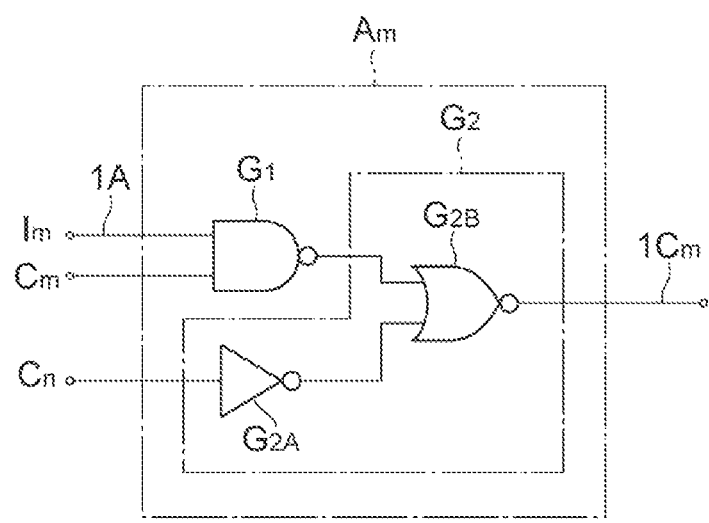
FIG. 7 is a diagram showing a second configuration example of the front unit $A_m$.

FIG. 7 is a diagram showing a second configuration example of the front unit $A_m$. As shown in FIG. 7, the second configuration example of the front unit $A_m$ includes a gate circuit $G_1$ and a gate circuit $G_2$. The gate circuit $G_1$ receives two of an input signal $I_m$, a control signal $C_m$, and a control signal $C_n$, and outputs a signal indicating a logical NAND between the received signals. In the example of FIG. 7, the gate circuit $G_1$ receives the input signal $I_m$ and the control signal $C_m$, and outputs a signal indicating a logical NAND between the received signals.

The gate circuit $G_2$ receives the output signal of the gate circuit $G_1$, and the logically inverted signal of the other one of the input signal $I_m$, the control signal $C_m$, and the control signal $C_n$, and outputs a signal indicating a logical NOR between the received signals. In the example of FIG. 7, the gate circuit $G_2$ receives the output signal of the gate circuit $G_1$ and the logically inverted signal of the control signal $C_n$ and outputs a signal indicating a logical NOR between the received signals. Specifically, the gate circuit $G_2$ includes the gate circuit $G_{2A}$ which receives the control signal $C_n$ and outputs a logically inverted signal thereof, and the gate circuit $G_{2B}$ which receives the output signal of the gate circuit GA and the output signal of the gate circuit $G_1$ and outputs a signal indicating a logical NOR between the received signals.

The significant levels of the control signal $C_m$ and the control signal $C_n$ are the H-levels, and the non-significant levels are the L-levels. Thus, in the second configuration example of the front unit $A_m$, when the control signal $C_m$ is the H-level and the control signal $C_n$ is the H-level, the input signal $I_m$ is output as the signal corresponding to the input signal $I_m$. On the other hand, when the control signal $C_m$ is the L-level or the control signal $C_n$ is the L-level, a signal having a voltage level of the ground is output as the signal having the L-level.

Figure 8:
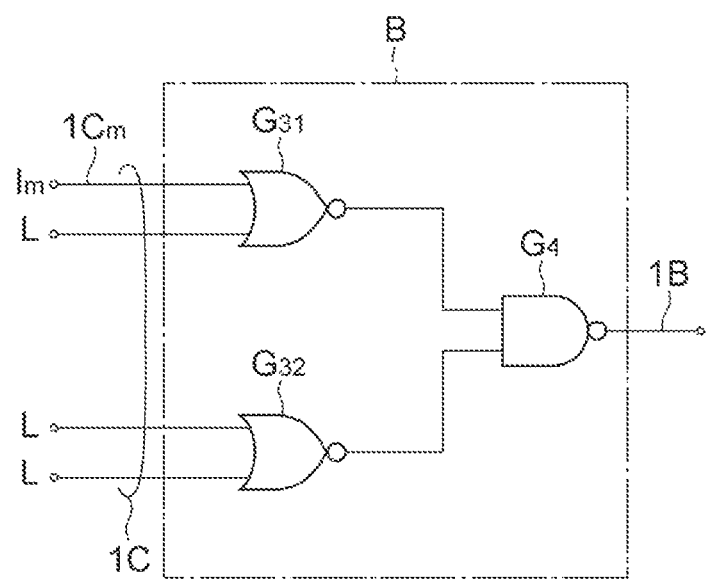
FIG. 8 is a diagram showing a first configuration example of the rear unit B.

FIG. 8 is a diagram showing a first configuration example of the rear unit B. As shown in FIG. 8, the first configuration example of the rear unit B is a configuration example when M=4, and includes two gate circuits $G_{31}$ and $G_{32}$ and a gate circuit $G_4$. The two gate circuits $G_{31}$ and $G_{32}$ each exclusively receive two signals of the signals output from the four front units $A_1$ to $A_4$, and each output a signal indicating a logical NOR between the received signals. In the example of FIG. 8, the gate circuit $G_{31}$ receives the input signal $I_m$ and the signal having the L-level, and outputs a logically inverted signal of the input signal $I_m$. The gate circuit $G_{32}$ receives two signals having the L-levels, and outputs a signal having the H-level.

The gate circuit $G_4$ receives the signals output from the two gate circuits $G_{31}$ and $G_{32}$, and outputs a signal indicating a logical NAND between the received signals. In the example of FIG. 8, the gate circuit $G_4$ receives the logically inverted signal of the input signal $I_m$ from the gate circuit $G_{31}$, receives the signal having the H-level from the gate circuit $G_{32}$, and outputs the input signal $I_m$. As described above, the first configuration example of the rear unit B receives the input signal $I_m$ and three signals having the L-levels output from the four front units $A_1$ to $A_4$, and outputs the input signal $I_m$.

Figure 9:
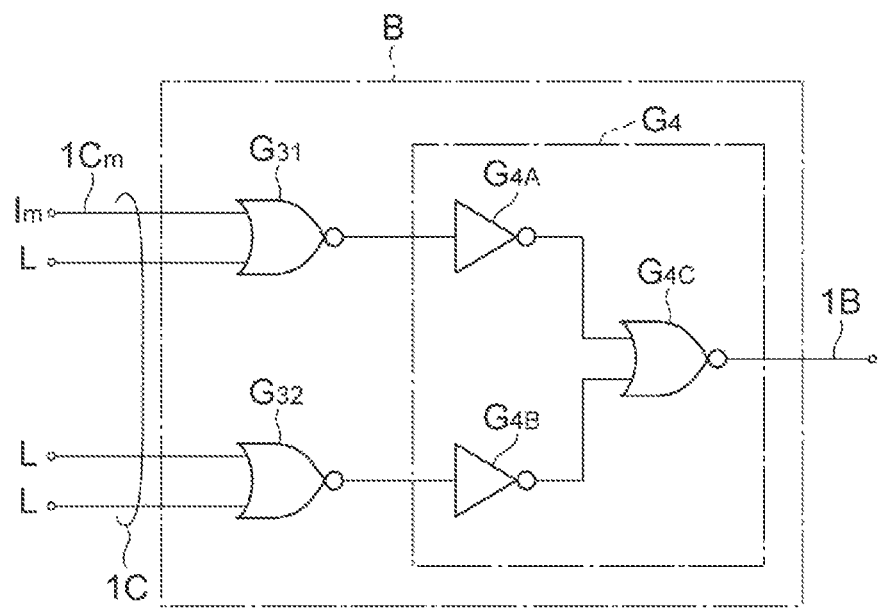
FIG. 9 is a diagram showing a second configuration example of the rear unit B.

FIG. 9 is a diagram showing a second configuration example of the rear unit B. As shown in FIG. 9, the second configuration example of the rear unit B is a configuration example when M=4, and includes two gate circuits $G_{31}$ and $G_{32}$ and a gate circuit $G_4$. The two gate circuits $G_{31}$ and $G_{32}$ have the same configurations as those of the two gate circuits $G_{31}$ and $G_{32}$ of the first configuration example of the rear unit B.

The gate circuit $G_4$ receives the signals output from the two gate circuits $G_{31}$ and $G_{32}$, and outputs a signal indicating a logical AND between the received signal. Specifically, the gate circuit $G_4$ includes the gate circuit $G_{4A}$ and the gate circuit $G_{4B}$ which each exclusively receive either one of the signals output from the two gate circuits $G_{31}$ and $G_{32}$, and each output the logically inverted signal of the received signal, and a gate circuit $G_{4C}$ which receives the signals output from the gate circuit $G_{4A}$ and the gate circuit $G_{4B}$ and outputs a signal indicating a logical NOR between the received signals.

In the example of FIG. 9, the gate circuit $G_{4A}$ receives the logically inverted signal of the input signal $I_m$ from the gate circuit $G_{31}$, and outputs the input signal $I_m$. The gate circuit $G_{4B}$ receives the signal having the H-level from the gate circuit $G_{32}$, and outputs a signal having the L-level. The gate circuit $G_{4C}$ receives the input signal $I_m$ from the gate circuit $G_{31}$, receives the signal having the L-level from the gate circuit $G_{32}$, and outputs a logically inverted signal of the input signal $I_m$.

As described above, the second configuration example of the rear unit B receives the input signal $I_m$ and three signals having the L-levels output from the four front units $A_1$ to $A_4$, and outputs a logically inverted signal of the input signal $I_m$. Note that, the two gate circuits $G_{31}$ and $G_{32}$ may output a signal indicating a logical OR between the received signals, and the gate circuit $G_4$ may output a signal indicating a logical NOR between the received signals.

Figure 10:
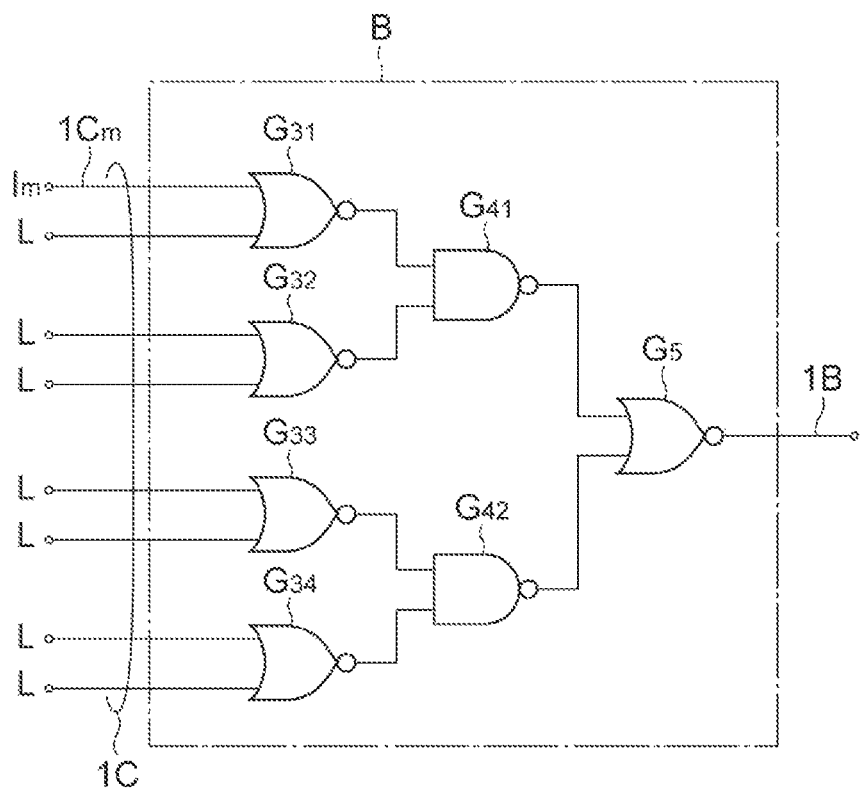
FIG. 10 is a diagram showing a third configuration example of the rear unit B.

FIG. 10 is a diagram showing a third configuration example of the rear unit B. As shown in FIG. 10, the third configuration example of the rear unit B is a configuration example when M=8, and includes four gate circuits $G_{31}$ to $G_{34}$, two gate circuits $G_{41}$ and $G_{42}$, and a gate circuit $G_5$. The four gate circuits $G_{31}$ and $G_{34}$ each exclusively receive two signals of the signals output from the eight front units $A_1$ to $A_8$, and each output a signal indicating a logical NOR between the received signals. In the example of FIG. 10, the gate circuit $G_{31}$ receives the input signal $I_m$ and the signal having the L-level, and outputs a logically inverted signal of the input signal $I_m$. The gate circuits $G_{32}$ to $G_{34}$ each receive two signals having the L-levels, and each output a signal having the H-level.

The two gate circuits $G_{41}$ and $G_{42}$ each exclusively receive two signals of the signals output from the four gate circuits $G_{31}$ to $G_{34}$, and each output a signal indicating a logical NAND between the received signals. In the example of FIG. 10, the gate circuit $G_{41}$ receives the logically inverted signal of the input signal $I_m$ from the gate circuit $G_{31}$, receives the signal having the H-level from the gate circuit $G_{32}$, and outputs the input signal $I_m$. The gate circuit $G_{42}$ receives the signals having the H-levels from the gate circuit $G_{33}$ and the gate circuit $G_{34}$, and outputs a signal having the L-level.

The gate circuit $G_5$ receives the signals output from the two gate circuits $G_{41}$ and $G_{42}$, and outputs a signal indicating a logical NOR between the received signals. In the example of FIG. 10, the gate circuit $G_5$ receives the input signal $I_m$ from the gate circuit $G_{41}$, receives the signal having the L-level from the gate circuit $G_{42}$, and outputs a logically inverted signal of the input signal $I_m$. As described above, the third configuration example of the rear unit B receives the input signal $I_m$ and seven signals having the L-levels from the eight front units $A_1$ to $A_8$, and outputs a logically inverted signal of the input signal $I_m$.

Next, configuration examples of the front unit $A_m$ and the rear unit B when the fixed level is the H-level are described with reference to FIGS. 11 to 15.

Figure 11:
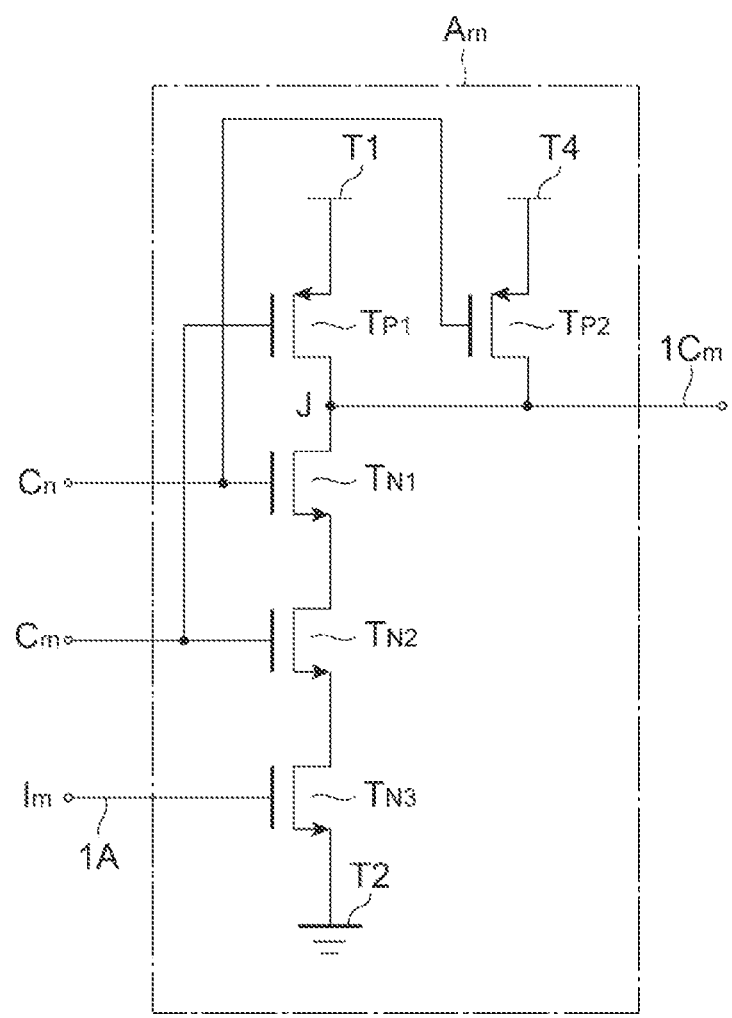
FIG. 11 is a diagram showing a third configuration example of the front unit $A_m$.

FIG. 11 is a diagram showing a third configuration example of the front unit $A_m$. As shown in FIG. 11, the third configuration example of the front unit $A_m$ includes three NMOS transistors $T_{N1}$ to $T_{N3}$ (included in a second transistor group) connected in series and two PMOS transistors $T_{P1}$ and $T_{P2}$ (included in a first transistor group) connected in parallel. The three NMOS transistors $T_{N1}$ to $T_{N3}$ and the two PMOS transistors $T_{P1}$ and $T_{P2}$ are connected in series, and its connecting point J is further connected with the rear unit B (see FIG. 1). The end part opposite to the connecting point J of the three NMOS transistors $T_{N1}$ to $T_{N3}$ is connected with a ground (a lower-limit reference end T2 set to lower-limit potential), and the end parts of the two PMOS transistors $T_{P1}$ and $T_{P2}$ opposite to the connecting point J are connected with the power sources (a first upper-limit reference end T1 set to first upper-limit potential and a second upper-limit reference end T4 set to second upper-limit potential).

Any one of the input signal $I_m$, the control signal $C_m$, and the control signal $C_n$ is exclusively input to the gate of each of the three NMOS transistors $T_{N1}$ to $T_{N3}$. In the example of FIG. 11, the control signal $C_n$ is input to the gate of the NMOS transistor $T_{N1}$, the control signal $C_m$ is input to the gate of the NMOS transistor $T_{N2}$, and the input signal $I_m$ is input to the gate of the NMOS transistor $T_{N3}$.

As shown in FIG. 3, after the input signal $I_m$ is output, the signals having the significant levels are output in the order of the control signal $C_m$ and the control signal $C_n$. Thus, when all the three NMOS transistors $T_{N1}$ to $T_{N3}$ shown in FIG. 11 are turned ON, the NMOS transistors are necessarily turned ON sequentially from the NMOS transistor farthest from the connecting point J. Consequently, it is possible to suppress the delay compared with, for example, the case in which the NMOS transistor farthest from the connecting point J is turned ON last.

Either one of the control signal $C_m$ or the control signal $C_n$ is exclusively input to the gate of each of the two PMOS transistors $T_{P1}$ and $T_{P2}$. Here, the control signal $C_m$ is input to the gate of the PMOS transistor $T_{P1}$, and the control signal $C_n$ is input to the gate of the PMOS transistor $T_{P2}$.

The significant levels of the control signal $C_m$ and the control signal $C_n$ are the H-levels, and the non-significant levels are the L-levels. Thus, in the third configuration example of the front unit $A_m$, when the control signal $C_m$ is the H-level and the control signal $C_n$ is the H-level, the input signal $I_m$ is output as the signal corresponding to the input signal $I_m$. On the other hand, when the control signal $C_m$ is the L-level or the control signal $C_n$ is the L-level, a signal having a voltage level of the power supply is output as the signal having the H-level.

Figure 12:
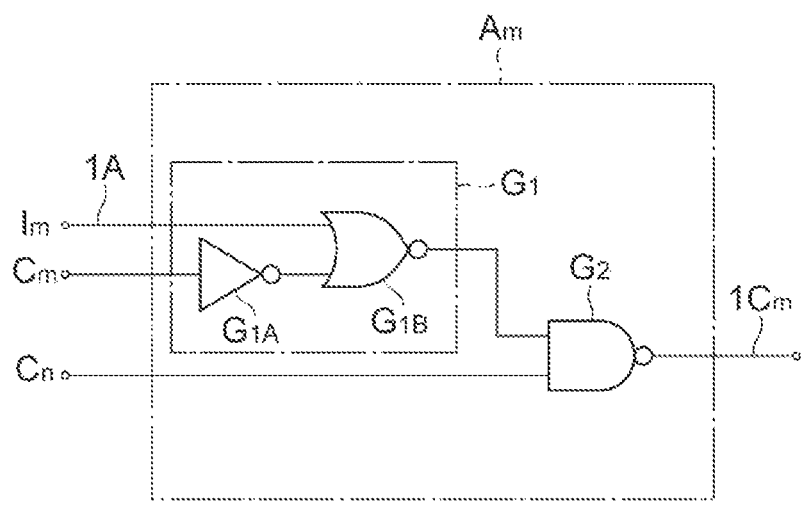
FIG. 12 is a diagram showing a fourth configuration example of the front unit $A_m$.

FIG. 12 is a diagram showing a fourth configuration example of the front unit $A_m$. As shown in FIG. 12, the fourth configuration example of the front unit $A_m$ includes a gate circuit $G_1$ and a gate circuit $G_2$. The gate circuit $G_1$ outputs a signal indicating a logical NOR between of a logically inverted signal of either one of the control signal $C_m$ or the control signal $C_n$ and the input signal $I_m$. In the example of FIG. 12, the gate circuit $G_1$ receives the logically inverted signal of the control signal $C_m$ and the input signal $I_m$, and outputs a logically inverted signal of the input signal $I_m$. Specifically, the gate circuit $G_1$ includes the gate circuit $G_{1A}$ which receives the control signal $C_m$ and outputs a logically inverted signal thereof, and the gate circuit $G_{2B}$ which receives the output signal of the gate circuit $G_{1A}$ and the input signal $I_m$ and outputs a signal indicating a logical NAND between the received signals.

The gate circuit $G_2$ receives the other one of the control signal $C_m$ and the control signal $C_n$, and the output signal of the gate circuit $G_1$, and outputs a signal indicating a logical NAND between the received signals. In the example of FIG. 12, the gate circuit $G_2$ receives the control signal $C_n$ and the output signal of the gate circuit $G_1$, and outputs a signal indicating a logical NAND between the received signals.

The significant levels of the control signal $C_m$ and the control signal $C_n$ are the H-levels, and the non-significant levels are the L-levels. Thus, in the fourth configuration example of the front unit $A_m$, the input signal $I_m$ is output as the signal corresponding to the input signal $I_m$ when the control signal $C_m$ is the H-level and the control signal $C_n$ is the H-level, and the signal having a voltage level of the power source is output as the signal having the H-level when the control signal $C_m$ is the L-level or the control signal $C_n$ is the L-level.

Figure 13:
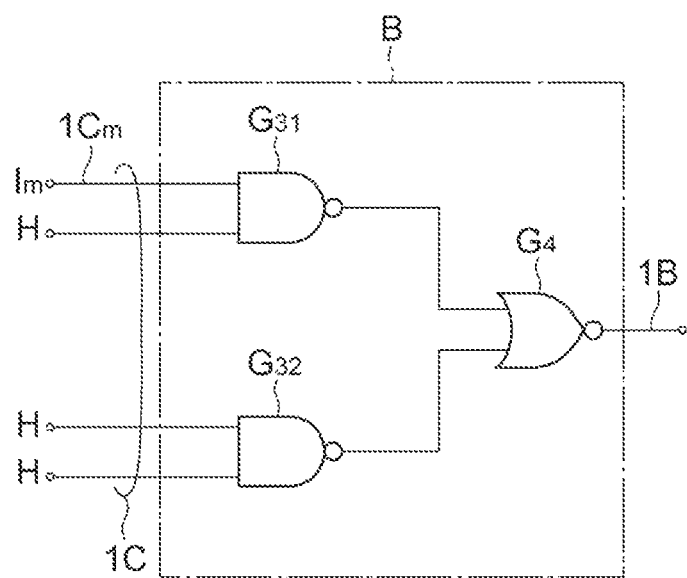
FIG. 13 is a diagram showing a fourth configuration example of the rear unit B.

FIG. 13 is a diagram showing a fourth configuration example of the rear unit B. As shown in FIG. 13, the fourth configuration example of the rear unit B is a configuration example when M=4, and includes two gate circuits $G_{31}$ and $G_{32}$ and a gate circuit $G_4$. The two gate circuits $G_{31}$ and $G_{32}$ each exclusively receive two signals of the signals output from the four front units $A_1$ to $A_4$, and each output a signal indicating a logical NAND between the received signals. In the example of FIG. 13, the gate circuit $G_{31}$ receives the input signal $I_m$ and the signal having the H-level, and outputs a logically inverted signal of the input signal $I_m$. Furthermore, the gate circuit $G_{32}$ receives two signals having the H-levels, and outputs a signal having the L-level.

The gate circuit $G_4$ receives the signals output from the two gate circuits $G_{31}$ and $G_{32}$, and outputs a signal indicating a logical NOR between the received signals. In the example of FIG. 13, the gate circuit $G_4$ receives the logically inverted signal of the input signal $I_m$ from the gate circuit $G_{31}$, receives the signal having the L-level from the gate circuit $G_{32}$, and outputs the input signal $I_m$. As described above, the fourth configuration example of the rear unit B receives the input signal $I_m$ output from the four front units $A_1$ to $A_4$ and three signals having the L-levels, and outputs the input signal $I_m$.

Figure 14:
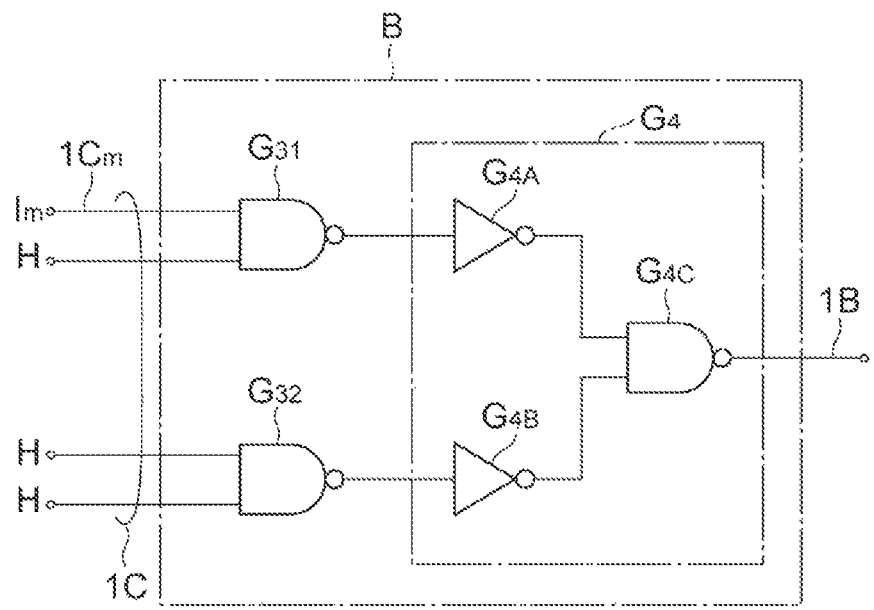
FIG. 14 is a diagram showing a fifth configuration example of the rear unit B.

FIG. 14 is a diagram showing a fifth configuration example of the rear unit B. As shown in FIG. 14, the fifth configuration example of the rear unit B is a configuration example when M=4, and includes two gate circuits $G_{31}$ and $G_{32}$ and a gate circuit $G_4$. The two gate circuits $G_{31}$ and $G_{32}$ have the same configurations as those of the two gate circuits $G_{31}$ and $G_{32}$ of the fourth configuration example of the rear unit B.

The gate circuit $G_4$ receives the signals output from the two gate circuits $G_{31}$ and $G_{32}$, and outputs a signal indicating a logical OR between the received signals. Specifically, the gate circuit $G_4$ includes the gate circuit $G_{4A}$ and the gate circuit $G_{4B}$ which each exclusively receive either one of the signals output from the two gate circuits $G_{31}$ and $G_{32}$, and each output a logically inverted signal of the received signal, and the gate circuit $G_{4C}$ which receives the signals output from the gate circuit $G_{4A}$ and the gate circuit $G_{4B}$ and outputs a signal indicating a logical NOR between the received signals.

In the example of FIG. 14, the gate circuit $G_{4A}$ receives the logically inverted signal of the input signal $I_m$ from the gate circuit $G_{31}$, and outputs the input signal $I_m$. The gate circuit $G_{4B}$ receives the signal having the L-level from the gate circuit $G_{32}$, and outputs a signal having the H-level. The gate circuit $G_{4C}$ receives the input signal $I_m$ from the gate circuit $G_{31}$, receives the signal having the H-level from the gate circuit $G_{32}$, and outputs a logically inverted signal of the input signal $I_m$.

As described above, the fifth configuration example of the rear unit B receives the input signal $I_m$ output from the four front units $A_1$ to $A_4$ and three signals having the H-levels, and outputs a logically inverted signal of the input signal $I_m$. Note that, the two gate circuits $G_{31}$ and $G_{32}$ may output a signal indicating a logical AND between the received signals, and the gate circuit $G_4$ may output a signal indicating a logical NAND between the received signals.

Figure 15:
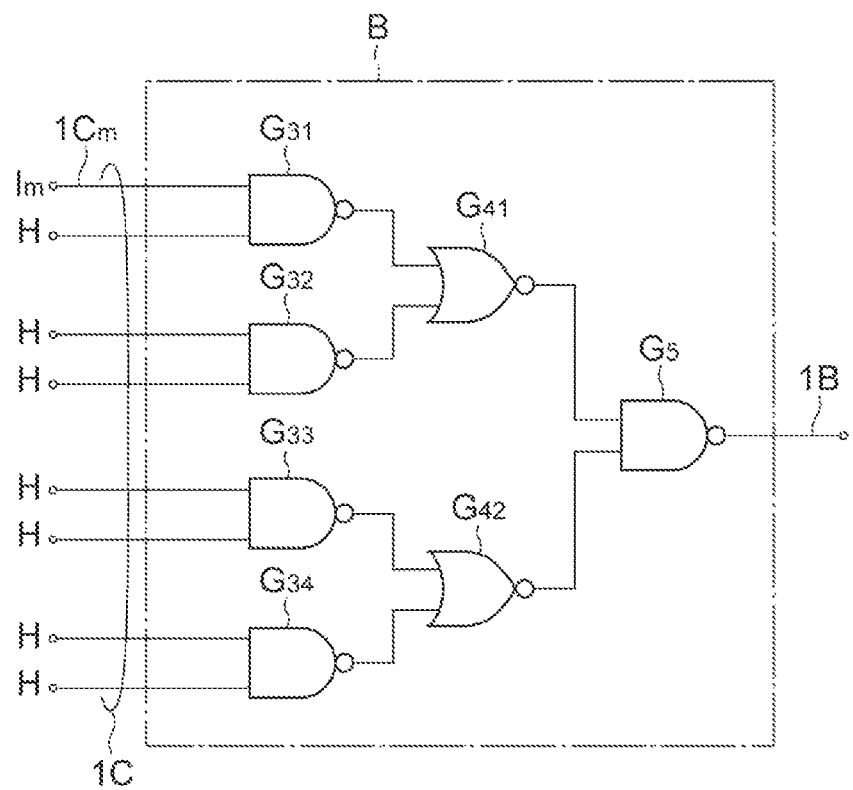
FIG. 15 is a diagram showing a sixth configuration example of the rear unit B.

FIG. 15 is a diagram showing a sixth configuration example of the rear unit B. As shown in FIG. 15, the sixth configuration example of the rear unit B is a configuration example when M=8, and includes four gate circuits $G_{31}$ to $G_{34}$, two gate circuits $G_{41}$ and $G_{42}$, and a gate circuit $G_5$. The four gate circuits $G_{31}$ to $G_{34}$ each exclusively receive two signals of the signals output from the eight front units $A_1$ to $A_8$, and each output a signal indicating a logical NAND between the received signals. In the example of FIG. 15, the gate circuit $G_{31}$ receives the input signal $I_m$ and the signal having the H-level, and outputs a logically inverted signal of the input signal $I_m$. The gate circuits $G_{32}$ to $G_{34}$ each receive two signals having the H-levels, and each output a signal having the L-level.

The two gate circuits $G_{41}$ and $G_{42}$ each exclusively receive two signals of the signals output from the four gate circuits $G_{31}$ to $G_{34}$, and each output a signal indicating a logical NOR between the received signals. In the example of FIG. 15, the gate circuit $G_{41}$ receives the logically inverted signal of the input signal $I_m$ from the gate circuit $G_{31}$, receives the signal having the L-level from the gate circuit $G_{32}$, and outputs the input signal $I_m$. The gate circuit $G_{42}$ receives the signals having the L-levels from the gate circuit $G_{33}$ and the gate circuit $G_{34}$, and outputs a signal having the H-level.

The gate circuit $G_5$ receives the signals output from the two gate circuits $G_{41}$ and $G_{42}$, and outputs a signal indicating a logical NAND between the received signals. In the example of FIG. 15, the gate circuit $G_5$ receives the input signal $I_m$ from the gate circuit $G_{41}$, receives the signal having the H-level from the gate circuit $G_{42}$, and outputs a logically inverted signal of the input signal $I_m$. As described above, the sixth configuration example of the rear unit B receives the input signal $I_m$ and seven signals having the H-levels from the eight front units $A_1$ to $A_8$, and outputs a logically inverted signal of the input signal $I_m$.

As described above, the first and fourth configuration examples of the rear unit B receive the input signal $I_m$ and (M−1) number of signals having the fixed levels from M number of front units $A_1$ to $A_M$, and outputs the input signal $I_m$. Furthermore, the second, third, fifth, and sixth configuration examples of the rear unit B receive the input signal $I_m$ and (M−1) number of signals having the fixed levels from the M number of front units $A_1$ to $A_M$, and outputs a logically inverted signal of the input signal $I_m$. Thus, the above configuration examples of the rear unit B output a signal having a different signal level in the case in which all the signal output from the M number of front units $A_1$ to $A_M$ are the same signal level or in the other case.

In the signal multiplexer 1 according to the above present embodiment, there is no configuration in which all output ends of the M number of front units $A_1$ to $A_M$ are connected with one connecting point. Thus, the signal multiplexer 1 can suppress the increase of the load capacity value and sufficiently accelerate the data rate compared with such a configuration having a multiplexed connecting point.

Furthermore, in the signal multiplexer disclosed in Non-Patent Literature 1, the parasitic resistance value and parasitic capacity value are high because two transfer gates are connected in series. For this reason, the waveform of an output signal becomes dull, and the frequency band is restricted. Thus, it is not possible to sufficiently accelerate the data rate.

In contrast, in the above configuration examples of the front unit $A_m$, there is no configuration in which two switches are connected in series. Thus, the parasitic resistance value and parasitic capacity value due to the switches become low, and it is possible to suppress the dullness of the waveform of an output signal. Consequently, it is possible to extend the frequency band. Thus, according to the signal multiplexer 1, it is possible to sufficiently accelerate the data rate. Furthermore, according to the signal multiplexer 1, it is possible to mitigate what is called a charge sharing effect. The charge sharing effect is a phenomenon in which the parasitic capacity is charged and discharged through a switch for turning ON a buffer section outputting a high impedance, and the waveform of an output signal thereby becomes dull.

Comparing the first to fourth configuration examples of the front unit $A_m$, in the first and third configuration examples, the number of gate circuits to be driven is fewer than that in the second and fourth configuration examples. For this reason, the first and third configuration examples can suppress the power consumption and delay.

Comparing the first configuration example of the front unit $A_m$ with the third configuration example, while the three PMOS transistors $T_{P1}$ to $T_{P3}$ are connected in series in the first configuration example, the three NMOS transistors $T_{N1}$ to $T_{N3}$ are connected in series in the third configuration example. Thus, in terms of the data rate, the first configuration example has an advantage compared with the third configuration example.

Comparing the first to sixth configuration examples of the rear unit B, while the last stage having the fastest data rate is a logical NAND in the first, fifth, and sixth configuration examples, the last stage having the fastest data rate is a logical NOR in the second, third, and fourth configuration examples. Generally, the data rate is faster in a logical NAND than in a logical NOR. Thus, in this point, the first, fifth, and sixth configuration examples have an advantage compared with the second, third, and fourth configuration examples.

The present invention is not limited to the above embodiments, and various modification can be made. For example, the circuit configurations of the front units $A_1$ to $A_M$ and the rear unit B are not limited to the above configuration examples, and may be various configurations.

As described above, according to the signal multiplexer according to the present embodiment, it is possible to sufficiently accelerate the data rate.

What is claimed is:

1. A signal multiplexer which outputs a signal corresponding to an input signal $I_m$ of M number of input signals $I_1$ to $I_M$ sequentially designated based on a combination of signal levels of an m-th control signal $C_m$ and an n-th control signal $C_n$ which are selected from M number of control signals $C_1$ to $C_M$, where M is an integer defined by $2^i$, i is an integer of 2 or greater, m is an integer of 1 to M, and n is an integer of 1 when m=M, and of m+1 when m<M, while the combination of the signal levels are being maintained, the signal multiplexer comprising:

M number of front units $A_1$ to $A_M$ corresponding to the M number of input signals $I_1$ to $I_M$, wherein an m-th front unit $A_m$ of the M number of front units $A_1$ to $A_M$ outputs an output signal corresponding to the input signal $I_m$ input to the front unit $A_m$ when both signal levels of the control signal $C_m$ and the control signal $C_n$ are significant, and outputs an output signal having a fixed signal level when at least either signal level of the control signal $C_m$ or the control signal $C_n$ is non-significant; and a rear unit electrically connected with output ends of the front units $A_1$ to $A_M$ configured to receive the output signals from the front units $A_1$ to $A_M$ and output, as the signal corresponding to the input signal $I_m$, a signal having one of a first signal level and a second signal level different from the first signal level, the first signal level indicating a first case in which all the output signals from the front units $A_1$ to $A_M$ are the same signal level, the second signal level indicating a second case different from the first case.

2. The signal multiplexer according to claim 1, wherein the front unit $A_m$ comprises:

a first transistor group including a first PMOS transistor $T_{P1}$ having a source electrically connected with an upper-limit reference end set to upper-limit reference potential, a gate, and a drain, a second PMOS transistor $T_{P2}$ having a source electrically connected with the drain of the first PMOS transistor, a gate, and a drain, and a third PMOS transistor $T_{P3}$ having a source electrically connected with the drain of the second PMOS transistor, a gate, and a drain, in which any one of the input signal $I_m$, the control signal $C_m$, and the control signal $C_n$ is exclusively input to the gate of each of the first to third PMOS transistors $T_{P1}$ to $T_{P3}$; and a second transistor group including a first NMOS transistor $T_{N1}$ having a drain electrically connected with the drain of the third PMOS transistor $T_{P3}$, a gate, and a source electrically connected with a first lower-limit reference end set to first lower-limit reference potential lower than the upper-limit reference potential, and a second NMOS transistor $T_{N2}$ having a drain electrically connected with the drain of the third PMOS transistor $T_{P3}$, a gate, and a source electrically connected with a second lower-limit reference end set to second lower-limit reference potential lower than the upper-limit reference potential, in which either one of the control signal $C_m$ or the control signal $C_n$ is exclusively input to the gate of each of the first and second NMOS transistors $T_{N1}$ and $T_{N2}$, and connecting points of the drain of the third PMOS transistor $T_{P3}$, and the drains of the first and second NMOS transistors $T_{N1}$ and $T_{N2}$ are electrically connected with the rear unit.

3. The signal multiplexer according to claim 2, wherein the rear unit, in order to receive output signals from the front units $A_1$ to $A_4$ of the front units $A_1$ to $A_M$, comprises:

two third gate circuits $G_{31}$ and $G_{32}$ configured to each exclusively receive two signals of the output signals from the front units $A_1$ to $A_4$, and each output a signal indicating a logical NOR between the received signals; and a fourth gate circuit $G_4$ configured to receive the signals output from the two third gate circuits $G_{31}$ and $G_{32}$, and output a signal indicating a logical NAND between the received signals.

4. The signal multiplexer according to claim 2, wherein the rear unit, in order to receive output signals from the front units $A_1$ to $A_4$ of the front units $A_1$ to $A_M$, comprises:

two third gate circuits $G_{31}$ and $G_{32}$ configured to each exclusively receive two signals of the output signals from the front units $A_1$ to $A_4$, and each output a signal indicating a logical NOR between the received signals; and a fourth gate circuit $G_4$ configured to receive the signals output from the two third gate circuits $G_{31}$ and $G_{32}$, and output a signal indicating a logical AND between the received signals.

5. The signal multiplexer according to claim 1, wherein the front unit $A_m$ comprises:

a first gate circuit configured to output a signal indicating a logical NAND between two of the input signal $I_m$, the control signal $C_m$, and the control signal $C_n$; and a second gate circuit configured to output a signal indicating a logical NOR between the output signal of the first gate circuit and a logically inverted signal of the other one of the input signal $I_m$, and the control signal $C_m$, and the control signal $C_n$.

6. The signal multiplexer according to claim 5, wherein the rear unit, in order to receive output signals from the front units $A_1$ to $A_4$ of the front units $A_1$ to $A_M$, comprises:

two third gate circuits $G_{31}$ and $G_{32}$ configured to each exclusively receive two signals of the output signals from the front units $A_1$ to $A_4$, and each output a signal indicating a logical NOR between the received signals; and a fourth gate circuit $G_4$ configured to receive the signals output from the two third gate circuits $G_{31}$ and $G_{32}$, and output a signal indicating a logical NAND between the received signals.

7. The signal multiplexer according to claim 5, wherein the rear unit, in order to receive output signals from the front units $A_1$ to $A_4$ of the front units $A_1$ to $A_M$, comprises:

two third gate circuits $G_{31}$ and $G_{32}$ configured to each exclusively receive two signals of the output signals from the front units $A_1$ to $A_4$, and each output a signal indicating a logical NOR between the received signals; and a fourth gate circuit $G_4$ configured to receive the signals output from the two third gate circuits $G_{31}$ and $G_{32}$, and output a signal indicating a logical AND between the received signals.

8. The signal multiplexer according to claim 1, wherein the rear unit, in order to receive output signals from the front units $A_1$ to $A_8$ of the front units $A_1$ to $A_M$, comprises:

four third gate circuits $G_{31}$ to $G_{34}$ configured to each exclusively receive two signals of the output signals from the front units $A_1$ to $A_8$, and each output a signal indicating a logical NOR between the received signals;

two fourth gate circuits $G_{41}$ and $G_{42}$ configured to each exclusively receive two signals of the signals output from the third gate circuits $G_{31}$ to $G_{34}$, and each output a signal indicating a logical NAND between the received signals; and a fifth gate circuit $G_5$ configured to receive the signals output from the two fourth gate circuits $G_{41}$ and $G_{42}$, and output a signal indicating a logical NOR between the received signals.

9. The signal multiplexer according to claim 1, wherein the front unit $A_m$ comprises:

a first transistor group including a first PMOS transistor $T_{P1}$ having a source electrically connected with a first upper-limit reference end set to first upper-limit reference potential, a gate, and a drain, and a second PMOS transistor $T_{P2}$ having a source electrically connected with a second upper-limit reference end set to second upper-limit reference potential, a gate, and a drain, in which either one of the control signal $C_m$ or the control signal $C_n$ is exclusively input to the gate of each of the first and second PMOS transistors $T_{P1}$ and $T_{P2}$; and a second transistor group including a first NMOS transistor $T_{N1}$ having a drain electrically connected with the drains of the first and second PMOS transistors $T_{P1}$ and $T_{P2}$, a gate, and a source, a second NMOS transistor $T_{N2}$ having a drain electrically connected with the source of the first NMOS transistor $T_{N1}$, a gate, and a source, and a third NMOS transistor $T_{N3}$ having a drain electrically connected with the source of the second NMOS transistor $T_{N2}$, a gate, and a source connected with a lower-limit reference end set to lower-limit reference potential lower than the first and second upper-limit reference potential, in which, any one of the input signal $I_m$, the control signal $C_m$, and the control signal $C_n$ is exclusively input to the gate of each of the first to third NMOS transistors $T_{N1}$ to $T_{N3}$, and connecting points between the drains of the first and second PMOS transistors $T_{P1}$ and $T_{P2}$ and the drain of the first NMOS transistor $T_{N1}$ are electrically connected with the rear unit.

10. The signal multiplexer according to claim 9, wherein the rear unit, in order to receive output signals from the front units $A_1$ to $A_4$ of the front units $A_1$ to $A_M$, comprises:
two third gate circuits $G_{31}$ and $G_{32}$ configured to each exclusively receive two signals of the output signals from the front units $A_1$ to $A_4$, and each output a signal indicating a logical NAND between the received signals; and
a fourth gate circuit $G_4$ configured to receive the signals output from the two third gate circuits $G_{31}$ and $G_{32}$, and output a signal indicating a logical NOR between the received signals.

11. The signal multiplexer according to claim 9, wherein the rear unit, in order to receive output signals from the front units $A_1$ to $A_4$ of the front units $A_1$ to $A_M$, comprises:
two third gate circuits $G_{31}$ and $G_{32}$ configured to each exclusively receive two signals of the output signals from the front units $A_1$ to $A_4$, and each output a signal indicating a logical NAND between the received signals; and
a fourth gate circuit $G_4$ configured to receive the signals output from the two third gate circuits $G_{31}$ and $G_{32}$, and output a signal indicating a logical OR between the received signals.

12. The signal multiplexer according to claim 9, wherein the rear unit, in order to receive output signals from the front units $A_1$ to $A_8$ of the front units $A_1$ to $A_M$, comprises:
four third gate circuits $G_{31}$ to $G_{34}$ configured to each exclusively receive two signals of the output signals from the front units $A_1$ to $A_8$, and each output a signal indicating a logical NAND between the received signals;
two fourth gate circuits $G_{41}$ and $G_{42}$ configured to each exclusively receive two signals of the signals output from the third gate circuits $G_{31}$ to $G_{34}$, and each output a signal indicating a logical NOR between the received signals; and
a fifth gate circuit $G_5$ configured to receive the signals output from the fourth gate circuits $G_{41}$ and $G_{42}$, and output a signal indicating a logical NAND between the received signals.

13. The signal multiplexer according to claim 1, wherein the front unit $A_m$ comprises:
a first gate circuit configured to output a signal indicating a logical NOR between a logically inverted signal of either one of the control signal $C_m$ or the control signal $C_n$, and the input signal $I_m$; and
a second gate circuit configured to output a signal indicating a logical NAND between the other one of the control signal $C_m$ and the control signal $C_n$, and the output signal of the first gate circuit.

14. The signal multiplexer according to claim 13, wherein the rear unit, in order to receive output signals from the front units $A_1$ to $A_4$ of the front units $A_1$ to $A_M$, comprises:
two third gate circuits $G_{31}$ and $G_{32}$ configured to each exclusively receive two signals of the output signals from the front units $A_1$ to $A_4$, and each output a signal indicating a logical NAND between the received signals; and
a fourth gate circuit $G_4$ configured to receive the signals output from the two third gate circuits $G_{31}$ and $G_{32}$, and output a signal indicating a logical NOR between the received signals.

15. The signal multiplexer according to claim 13, wherein the rear unit, in order to receive output signals from the front units $A_1$ to $A_4$ of the front units $A_1$ to $A_M$, comprises:
two third gate circuits $G_{31}$ and $G_{32}$ configured to each exclusively receive two signals of the output signals from the front units $A_1$ to $A_4$, and each output a signal indicating a logical NAND between the received signals; and
a fourth gate circuit $G_4$ configured to receive the signals output from the two third gate circuits $G_{31}$ and $G_{32}$, and output a signal indicating a logical OR between the received signals.

16. The signal multiplexer according to claim 13, wherein the rear unit, in order to receive output signals from the front units $A_1$ to $A_8$ of the front units $A_1$ to $A_M$, comprises:
four third gate circuits $G_{31}$ to $G_{34}$ configured to each exclusively receive two signals of the output signals from the front units $A_1$ to $A_8$, and each output a signal indicating a logical NAND between the received signals;
two fourth gate circuits $G_{41}$ and $G_{42}$ configured to each exclusively receive two signals of the signals output from the third gate circuits $G_{31}$ to $G_{34}$, and each output a signal indicating a logical NOR between the received signals; and
a fifth gate circuit $G_5$ configured to receive the signals output from the fourth gate circuits $G_{41}$ and $G_{42}$, and output a signal indicating a logical NAND between the received signals.

17. The signal multiplexer according to claim 1, further comprising a generation unit configured to generate the control signals $C_1$ to $C_M$.

18. The signal multiplexer according to claim 17, wherein the generation unit, in order to generate control signals $C_1$ to $C_8$ corresponding to the control signals $C_1$ to $C_M$, comprises:
first to fourth latch circuits; and
sixth to ninth gate circuits,
the sixth gate circuit outputs, as the control signal $C_1$, a signal indicating a logical AND between a second clock obtained by dividing a first clock by two, and a third clock obtained by diving the second clock by two,
the first latch circuit receives the control signal $C_1$, latches a value of the control signal $C_1$ at a falling timing of the first clock, and outputs the latched value as the control signal $C_2$,
the seventh gate circuit outputs, as the control signal $C_3$, a signal indicating a logical AND between a logically inverted signal of the second clock and the third clock,
the second latch circuit receives the control signal $C_3$, latches a value of the control signal $C_3$ at a falling timing of the first clock, and outputs the latched value as the control signal $C_4$,
the eighth gate circuit outputs, as the control signal $C_5$, a signal indicating a logical AND between the second clock and a logically inverted signal of the third clock,
the third latch circuit receives the control signal $C_5$, latches a value of the control signal $C_5$ at a falling timing of the first clock, and outputs the latched value as the control signal $C_6$,
the ninth gate circuit outputs, as the control signal $C_7$, a signal indicating a logical AND between a logically inverted signal of the second clock and a logically inverted signal of the third clock, and the fourth latch circuit receives the control signal $C_7$, latches a value of the control signal $C_7$ at a falling timing of the first clock, and outputs the latched value as the control signal $C_8$.

\* \* \* \* \*